United States Patent [19]
Vinograd et al.

[11] Patent Number: 5,876,630
[45] Date of Patent: Mar. 2, 1999

[54] SCINTILLATION MATERIAL ON THE BASE OF CESIUM IODIDE AND METHOD FOR ITS PREPARATION

[75] Inventors: Eduard L'Vovich Vinograd; Valentin Ivanovich Goriletsky; Ludmila Vasil'evna Kovaleva; Sofiya Petrovna Korsunova; Alexandr Mihailovich Kudin; Anatolii Ivanovich Mitichkin; Alexandra Nikolaevna Panova; Vladimir Grigor'evich Protsenko; Klavdia Viktorovna Shakhova; Larisa Nikolaevna Shpilinskaya, all of Kharkov, Ukraine

[73] Assignee: Amcrys-H, Kharkou, Ukraine

[21] Appl. No.: 854,410

[22] Filed: May 12, 1997

[30] Foreign Application Priority Data

May 14, 1996 [UA] Ukraine ................ 96051870

[51] Int. Cl.$^6$ .................................................. C09K 11/61
[52] U.S. Cl. ............................ 252/301.4 H; 252/301.17; 117/940
[58] Field of Search ............... 252/301.4 H, 301.17; 117/940

[56] References Cited

U.S. PATENT DOCUMENTS

| | | | |
|---|---|---|---|
| 4,030,965 | 6/1977 | Hammond et al. | 156/616 |
| 4,277,303 | 7/1981 | Swinehart | 156/616 |
| 4,341,654 | 7/1982 | Swinhart | 252/301.4 |

FOREIGN PATENT DOCUMENTS

| | | | |
|---|---|---|---|
| 1362088 | 7/1987 | U.S.S.R. | |
| 1538557 | 12/1992 | U.S.S.R. | |
| 1471546 | 1/1993 | U.S.S.R. | |
| WO 87/04177 | 7/1987 | WIPO | 252/301.4 H |

OTHER PUBLICATIONS

E.L. Vinograd et al., *Causes of Millisecond Afterglow of CsI(Na) Crystals*, J. of Appl. Spectr., 1990, v. 52, No. 2, pp. 317–319. (Summary translated) no month.

A. Dolgopolova et al, *Effective Scintillator for Computer Tomography*, Inter. Symp. "Luminescent Detectors and Transformers of Ionizing Radiation", Lundetr 94, Sep. 25–29, 1994, tallinn, Estonia.

D.G. Hitlin et al., *Radiation Hardness Studies of CsI Crystals*, Proceedings of the "Crystal 2000" International Workshop, Heavy Scintillation for Scientific and Industrial Applications edited by F.Dc Notaristefani et al, Frontieres, France, 1993, C58, pp. 467–478 no month.

*Radiation Detectors*, catalogue, Quartz et Silice firm, France, 1990 no month.

Chem. Abstract. Cit. 113:67601; Smol'skaya et al, "IR Absorption Spectra of Molecular Anions in Carbonate–Doped Cesium Iodide and Thallium– and Carbonate–Doped Cesium Iodide", Zh. Prikl. Spektrosk., vol. 52 (1), pp. 44–47, 1990: no month.

Chem. Abstract. Cit. 100:218331; Smol'skaya et al, "Luminescence Centers and Mechanism of Formation of Activator Centers A20(A2+) in Thallium– and Carbonate–Doped Cesium Iodide Crystals", Sb. Nauchn. Tr.–Vses. Nauchno–Issled. Inst. Monokrist., Stsintill. Mater Oscho Chist. Khim. Veschestv, p. 11–17, 1982: no month.

*Primary Examiner*—Melissa Bonner
*Attorney, Agent, or Firm*—Kinney & Lange, P.A.

[57] ABSTRACT

A cesium iodide based scintillation material is obtained exhibiting a low afterglow and high radiation hardness; its preparation method is developed, too.

The cesium iodide based scintillation material doped by thallium iodide contains an additional admixture of compound having the general formula $$Me_x(CO_3)_y,$$

where Me is a cationic admixture, $1 \leq X \leq 2$, $1 \leq Y \leq 5$,

This material has in its absorption spectrum a stretching vibration band of $CO_3^{2-}$-ion about 7 $\mu$m and a bending vibration band about 11.4 $\mu$m, the absorption coefficient of the latter being from $1.4 \cdot 10^{-3}$ to $2 \cdot 10^{-2}$ cm$^{-1}$.

Preparation method of this scintillation material comprises the raw material cesium iodide melting, adding of the activating thallium iodide dope, introduction of cesium carbonate ($3 \cdot 10^{-4}$ to $5 \cdot 10^{-3}$% by mass) and a sodium salt ($3 \cdot 10^{-4}$ to $7.5 \cdot 10^{-3}$% of Na by mass) into said raw material and/or the melt and a subsequent crystallization.

7 Claims, No Drawings

SCINTILLATION MATERIAL ON THE BASE OF CESIUM IODIDE AND METHOD FOR ITS PREPARATION

FIELD OF INVENTION

This invention is related to the field of doped single crystals growth and can be used in the production of scintillators applicable in nuclear, space, geophysic research instruments as well as in medical and industrial computer tomography.

BACKGROUND OF THE INVENTION

Scintillators use in high-energy fields of ionizing radiation and in time-resolution apparatus imposes increased requirements to a single crystal in respect to radiation hardness and afterglow in millisecond range. This is of particular importance for cesium iodide scintillator doped by thallium (CsI—Tl) that has attract considerable interest in connection to wide use of photodiodes as scintillation light receivers, since CsI—Tl has a long-wave emission range ($\lambda$=550 nm) and, therefore, ensures a high spectral correlation coefficient with photodiodes.

Recently, extensive use is made of gamma spectrometers and electromagnetic calorimeters based on large-size assemblies of modular detectors in form of prisms and truncated pyramids from 250 to 500 mm in height (H). One of main requirements to these elements is, together with high scintillation parameters, the homogeneity of characteristics over the detector height. To this end, large-size scintillation crystals are required characterized by homogeneous radial and axial activator distribution having high radiation hardness. Furthermore, large-size scintillation crystals with homogeneous activator distribution and low afterglow are of considerable interest for detection systems including a large number (several thousands) of small-size scintillators having identical parameters. Among other cases, such a requirement is imposed by the computer tomography.

A scintillation material has been disclosed (U.S. Pat. No. 4,341,654) based on an alkali iodide crystal activated by an optimal amount of effective scintillating dope and containing from 5 to 1000 ppm (of the melt mass) of each complex component of the getter consisting of boron oxides as one component and insoluble but active silicon dioxide as another one.

Method for preparation of this material includes melting of cesium iodide containing raw material, introduction of the activating dope thallium or sodium iodide, as well as additional introduction of boron oxide and silicon dioxide, each in amount of 5 to 1000 ppm by weight, into said raw material, superheating of the melt for time period required to oxides interaction with impurities traces in the melt, with subsequent crystallization and cooling to the room temperature. Authors have pointed out that scintillation materials can be obtained both by Stockbarger and Kyropoulos methods.

Using this method, scintillation materials were grown—sodium iodide doped by thallium (NaI—Tl) and cesium iodide doped by sodium (CsI—Na)—which were colourless, insensitive to one-minute irradiation by a light source with $\lambda$=360 nm and having no appreciable afterglow. Yet, there is no information in the method description about CsI—Tl crystals preparation.

A disadvantage of the method mentioned is the settling of the flocks-like interaction products of the getter with the melt. It is particularly a problem when large-size crystals are to be grown since, in this case, the getter amount should be significant enough. Authors state that those floks are displaced into peripheral segments of the ingot. However, a certain probability remains always that those will fall in the crystal bulk. In particular, when crystals are grown by pulling-out from the melt on a seed (Kyropoulos method and modifications thereof), the flocks may emerge to the melt surface where they are captured by the crystal in growth.

Thallium-doped scintillation material on the basis of cesium iodide is known (USSR A.C. N 1,362,088) containing additionally a cesium bromide admixture and having a composition corresponding to the formula

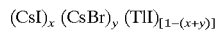

where $0.947 \leq x \leq 0.948$ and $0.049 \leq y \leq 0.050$.

Preparation method of this scintillation material includes melting of a blend containing cesium iodide, activating thallium iodide dope, graphite as a deacidifying agent; additional introduction of cesium bromide in the amount of 5% by mass and thallium in the amount of 0.6 to 1.0% by mass; and subsequent directional crystallization at the residual pressure in the ampoule not exceeding 5 Torr.

Crystals obtained by this method have, in fact, a high transparency to the activator emission (0.005 cm$^{-1}$ on $\lambda$=560 nm), short decay time ($\tau$=0.45 $\mu$s) and low afterglow; but authors did not specified scintillation parameters and afterglow for crystals prepared using this method. We have reproduced the conditions of material preparation according to USSR A.C. No 1,362,088 (see Example 1 and Table 1). Disadvantages of that method are its technical difficulty and feasibility in Bridgman-Stockbarger methods only, where graphite comes up into the upper part of ampoule while the melt crystallization starts in the lower (conical) one. When a method of crystal pulling on a seed is used, the crystallization occurs in the surface melt layer where the presence of any suspended particles is inadmissible.

As for quality level of crystals produced by leading worldwide known firms, radiation damage studies of CsI—Tl crystals produced by Quartz et Silice (France) and by Horiba (Japan) have shown that the latter have a rather low radiation hardness, their light yield decrease ($\Delta$C/C) at doses about 10$^3$ rad being 65%. Crystals of Quartz et Silice are more radiation-resistant, for their $\Delta$C/C at 10$^3$ rad dose in 15 to 18%, but at 10$^4$ rad doses, the light yield drops by 30% for large-size articles and less than by 10% for small-size detectors (D. G. Hitlin. G. Eigen "Radiation hardness studies of CsI crystals", Proceedings of the "Crystal 2000" International workship,"Heavy scintillators for scientific and industrial applications" edited by F. Dc Notaristefani et al, "Frontieres", France, 1993, C 58, p. 467–478 ).

Afterglow of CsI—Tl crystals produced by world leading firms is from 0.5 to 5.0% after 3 ms (see, for example. Radiation detectors Catalogue by Quartz et Silice, France, 1990).

BRIEF SUMMARY OF THE INVENTION

The object of this invention is to develop a scintillation material based on CsI—Tl crystal having low afterglow and high radiation hardness as well as technically convenient method of preparation thereof allowing to grow large-size crystals both by Bridgman-Stockbarger methods and by pulling out of the melt on a seed. The latter method ensures the homogeneous axial and radial activator distribution together with high scintillation parameters.

This object is attained by that, according to the invention, a cesium iodide based scintillation material doped by thallium iodide contains an additional admixture of a compound having the general formula $Me^x (CO_3)_y$, where Me is a cationic admixture, $1 \leq X \leq 2$, $1 \leq Y \leq 5$.

Therewith, the scintillation material has in its absorption spectrum a stretching vibration band of $CO_3^{2-}$-ion about 7 $\mu m$ and a bending vibration band about 11.4 $\mu m$, the absorption coefficient of the latter is from $1.4 \cdot 10^{-3}$ to $2 \cdot 10^{-2} \cdot cm^{-1}$.

The attaining of the object mentioned is ensured also by that a method for preparation of a cesium iodide based scintillation material comprises melting of the raw material cesium iodide, introduction of the activating thallium iodide dope, cesium carbonate in an amount from $3 \cdot 10^{-4}$ to $5 \cdot 10^{-3}$% by mass and a sodium salt in an amount from $3 \cdot 10^{-4}$ to $7.5 \cdot 10^{-3}$% of Na by mass into said raw material and/or the melt and subsequent crystallization.

Study of factors causing an afterglow of CsI—Tl crystals in millisecond range has shown that it is associated with destruction of color centers in the temperature range 210–215 K, which formation is known to be stimulated by the presence of carrier trapping centers in the crystal, namely, heterovalent cationic impurities and cationic vacances compensating their charge.

Investigations have shown that the carbonate ions present in the melt favour the formation of stable compounds of heterovalent cations with carbonate ions taking no part in charge carriers trapping as well as of cesium peroxidic compounds hindering the stable color center formation in the visible spectral region. These processes result in disappearing of trapping centers positioned in the temperature range 210–215 K responsible for the millisecond-range afterglow and in an increase of the crystal radiation hardness. The excess carbonate ions are bounded by the introduced sodium salt admixture.

Limiting values are experimentally established for cesium carbonate and sodium salts ensuring the the millisecond-range afterglow of CsI—Tl crystals within limits from 0.03 to 0.50% in 5 ms after irradiation and their radiation hardness (see Table 2). The light output change did not exceed 10% after $10^5$ rad dose of gamma radiation for detectors ø 25×20 mm. Insufficient amount of cesium carbonate and sodium salts results in a significant afterglow increase up to 0.36–0.77% as well as in radiation hardness decrease, therewith, $\Delta C/C$ is from 33 to 48%. An excess of both sodium salts and cesium carbonate causes formation of turbid parts in a crystal.

The chosen admixtures concentrations ensure the required range of the 11.4 $\mu m$ band absorption coefficients. At $5.5 \cdot 10^{-3}$ $cm^{-1} \leq K \leq 2 \cdot 10^{-2}$ $cm^{-1}$, afterglow value is from 0.03 to 0.10%, while at $1.4 \cdot 10^{-3}$ $cm^{-1} \leq K \leq 5.5 \cdot 10^{-3}$ $cm^{-1}$, the afterglow increases up to 0.5%, radiation hardness being retained.

BRIEF DESCRIPTION OF THE TABLES

Investigation results of scintillation detectors prepared from crystals obtained in accordance with USSR A.C. No 1,362,088 at various percentages of thallium iodide dope are given in Table 1.

Table 2 presents characteristics of scintillation detectors made from crystals obtained according to this application.

DESCRIPTION OF THE PREFERRED EMBODIMENTS

1. In accordance with the method of USSR A.C. N 1,362,088, 500 g of cesium iodide (special purity grade), 2,5 g of graphite (spectral purity grade), 3 g of thallium iodide and 25 g of cesium bromide were charged into a quartz ampoule of 56 mm in diameter with conical bottom and the inner surface coated with a thin layer of graphite. The raw material was melted in the overheat regime at 850° C. and then the temperature was dropped down to 650° C. Two crystals were obtained containing various amounts of thallium iodide dope (0.6 and 1.0% by mass) and used to prepare four detectors of 25 mm in diameter and 20 mm in height. Investigation results for those crystals are presented in Table 1.

2. In accordance with this application to grow a crystal of 300 mm in diameter, 250 kg of cesium iodide (special purity grade) were dried at 150° C. and mixed with 5.0 g of cesium carbonate ($2 \cdot 10^{-3}$% by mass). A portion of the raw material was charged into a crucible, the remaining amount was placed into the feeder. A seed being fastened, the furnace was sealed and evacuated. Under continuous pumping-out, the furnace temperature was raised to 600° C. and the raw material was dried for 24 h. The furnace chamber was filled with an inert gas and then crystal seeding and growth up to the diameter specified was performed, 125 g of sodium iodide ($7.7 \cdot 10^{-3}$% of Na by mass) and 1250 g of thallium iodide ($5 \cdot 10^{-1}$% by mass) were added to the blend and automated crystal growth up to the height required was processed under feeding by the melt (blend) of the specified composition.

3. According to the method of this application, to grow a crystal of 100 mm diameter, 5 kg of cesium iodide were dried at 150° C., mixed with 40 mg of cesium carbonate ($8 \cdot 10^{-4}$% by mass) and charged into a quartz ampoule with conical bottom. The ampoule was placed into the growth furnace of Stockbarger type and evacuated. Under continuous pumping-out, temperature in upper chamber of the furnace was raised to 550° C. and the raw material was dried for 12 h, then the temperature was raised to 650° C. When the raw material was melted, the pumping-out was stopped, 0.3 g of sodium bromide ($1.3 \cdot 10^{-3}$% of Na by mass) and 15 g of thallium iodide ($3 \cdot 10^{-1}$% by mass) were introduced without the vacuum deterioration and the ampoule was sealed. The melt was exposed for 6 h to homogenize and the mechanism was put on to displace the ampoule vertically through the gradient zone into the lower furnace chamber at rate of 2 mm/h up to the complete ingot crystallization.

4. To grow a crystal, 5 kg of cesium iodide were dried at 150° C., mixed with 50 mg of cesium carbonate ($1 \cdot 10^{-3}$% by mass) and 205 mg of sodium iodide ($6.2 \cdot 10^{-4}$% of Na by mass) charged into a quartz ampoule, placed into a growth furnace evacuated and processed further as described in Ex.3.

By the same method, at technical parameters values according to the invention, radiation-hard cesium iodide crystals doped by thallium were prepared having the afterglow from 0.03 to 0.5% in 5 ms after an X-ray pulse action of 10 ms duration (see Table 2).

To study obtained crystals in more detail, scintillation parameters and radioluminescence spectral composition were controlled for samples cut out from various crystal parts. The light output and energy resolution of ø 25×20 mm detectors in the standard packages and radioluminescence spectral composition of ø 30×5 mm samples were measured using standard procedures.

Afterglow intensity was controlled in 5 ms after an X-ray pulse of 10 ms duration. As a measure for the radiation hardness estimation, the light output of ø 25×20 mm detectors change ($\Delta C/C$) after gamma-irradiation by a cobalt gun at $10^5$ rad dose was determined.

| Activator and admixture mass part, % | | | Afterglow intensity | $\Delta C/C$, % after δ-irradiation |
|---|---|---|---|---|
| TlI | CsBr | graphite | after 5 ms, % | $^{60}Co$ $10^5$ rad |
| 0.6 | 5.0 | 0.5 | 0.06 | 5.9 |
| 0.6 | 5.0 | 0.5 | 0.06 | 5.0 |
| 1.0 | 5.0 | 0.5 | 0.09 | 8.5 |
| 1.0 | 5.0 | 0.5 | 0.10 | 9.0 |

As it is seen from Table 1, parameters of detectors prepared from crystals obtained in accordance with the method disclosed in USSR A.C. N 1362088 are close to those of detectors prepared from crystals grown according to the method of this application (see Table 2). However, as is mentioned above, the method according to USSR A.C. N 1362088 is less convenient technologically and cannot be used to grow large-size crystals by pulling from the melt on a seed, since graphite emerges to the melt surface into the crystal growth zone.

As it is seen from Table 2, crystals prepared according to the invention are characterized by low afterglow intensity (0.03–0.5%) and by high radiation hardness. Furthermore, the spectral composition of emission for those crystals remained unchanged at the chosen admixtures concentrations.

enhanced radiation hardness as well as a low afterglow in the millisecond range. Therewith, these crystals have not only high scintillation parameters but also homogeneous (10%) properties through the crystal bulk.

We claim:

1. Single crystal scintillation material of cesium iodide doped by thallium iodide containing an additional admixture of a compound having the general formula $$Me_x(CO_3)_y$$

where Me is a cationic admixture, $$1 \leq X \leq 2$$

$$1 \leq Y \leq 5$$

having a sodium content in an amount from $3 \cdot 10^{-4}$ to $7.5 \cdot 10^{-3}\%$ by mass, having a carbonate content in an amount from $5.4 \cdot 10^{-5}$ to $9.2 \cdot 10^{-4}\%$ by mass, and having a diameter of at least 25 mm.

2. Single crystal scintillation material according to claim 1 containing in its absorption spectrum a stretching vibration band of $CO_3^{2-}$-ion about 7 μm and a bending vibrations band about 11.4 μm, wherein the absorption coefficient of the bending vibrations band is from $1.4 \cdot 10^{-3}$ to $2 \cdot 10^{-2}$ $cm^{-1}$.

3. Single crystal scintillation material according to claim 1, having a radiation hardness to produce a light yield drop of less than about 10% after gamma irradiation by $^{60}Co$ at a dose of $10^5$ rad.

4. Single crystal scintillation material according to claim 1, having an afterglow intensity from 0.03 to 0.5% measured 5 ms after an X-ray pulse of 10 ms duration.

5. Single crystal scintillation material according to claim 1, having a diameter of more than 300 mm.

6. Single crystal scintillation material according to claim 1, having a diameter of at least 300 mm and a height of at least 300 mm.

TABLE 2

| Activator and admixtures mass part, p.o. | | | | Absorption coefficient on 11.4 μm, | After-glow intensity after | $\Delta C/C$, % after δ irradiation by $^{60}Co$ | Energy resolution | Note |
|---|---|---|---|---|---|---|---|---|
| TlI | NaI | NaBr | $Cs_2CO_3$ | $cm^{-1}$ | 5 ms, % | $10^5$ rad | % | |
| 0.5 | $9 \cdot 10^{-4}$ | — | $1 \cdot 10^{-4}$ | $1.0 \cdot 10^{-3}$ | 0.77 | 48 | 11.5 | |
| 0.5 | $2 \cdot 10^{-3}$ | — | $3 \cdot 10^{-4}$ | $1.4 \cdot 10^{-3}$ | 0.45 | 8 | 8.5 | |
| 0.5 | $7 \cdot 10^{-3}$ | — | $1 \cdot 10^{-3}$ | $6.0 \cdot 10^{-3}$ | 0.04 | 5 | 8.0 | |
| 0.3 | $5 \cdot 10^{-2}$ | — | $5 \cdot 10^{-3}$ | $2.0 \cdot 10^{-2}$ | 0.05 | 5 | 6.0 | Opalescence |
| 0.3 | $1 \cdot 10^{-1}$ | — | $6 \cdot 10^{-3}$ | $4.0 \cdot 10^{-2}$ | 0.06 | 7 | 12.0 | Turbit parts |
| 0.3 | — | $9.0 \cdot 10^{-4}$ | $1 \cdot 10^{-4}$ | $9.0 \cdot 10^{-4}$ | 0.80 | 33 | 8.0 | |
| 0.3 | — | $1.3 \cdot 10^{-3}$ | $3 \cdot 10^{-4}$ | $1.5 \cdot 10^{-3}$ | 0.36 | 7 | 7.0 | |
| 0.5 | — | $5.0 \cdot 10^{-3}$ | $1 \cdot 10^{-3}$ | $7.0 \cdot 10^{-3}$ | 0.03 | 6 | 7.0 | |
| 0.5 | — | $3.3 \cdot 10^{-2}$ | $5 \cdot 10^{-3}$ | $1.8 \cdot 10^{-2}$ | 0.05 | 5 | 6.5 | Opalescence |
| 0.5 | — | $5.0 \cdot 10^{-2}$ | $6 \cdot 10^{-3}$ | $3.0 \cdot 10^{-2}$ | 0.04 | 5 | 12.0 | Turbit parts |

For 300 mm diameter crystals obtained by pulling-out on a seed, radial and axial activator (thallium) distribution was analysed and the concentration uniformity was found to be better than 10% what is of particular importance when long-size prisms and pyramids (H=300 mm) are produced used in modern calorimeters.

Thus, the method proposed allows to grow scintillation crystals of more than 300 mm diameter characterized by 7. Method for preparation of a cesium iodide based single crystal scintillation material comprises melting of the raw material cesium iodide, introduction of the activating thallium iodide dope, introduction of cesium carbonate in an amount from $3 \cdot 10^{-4}$ to $5 \cdot 10^{-3}\%$ by mass and a sodium salt in an amount from $3 \cdot 10^{-4}$ to $7.5 \cdot 10^{-3}\%$ of Na by mass into said raw material and/or the melt and subsequent crystallization.

* * * * *